(12) United States Patent
Prindiville

(10) Patent No.: US 6,949,824 B1
(45) Date of Patent: Sep. 27, 2005

(54) INTERNAL PACKAGE HEAT DISSIPATOR

(75) Inventor: Casey L. Prindiville, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/547,640

(22) Filed: Apr. 12, 2000

(51) Int. Cl.$^7$ ............................................. H01L 23/48
(52) U.S. Cl. ..................... 257/712; 257/717; 257/713; 257/720; 257/786; 257/666; 257/673; 257/696; 257/737; 257/738; 257/787; 257/675; 257/668; 257/698
(58) Field of Search ................................ 257/712, 713, 257/717, 720, 786, 666, 673, 692, 642, 693, 257/696, 678, 675, 676, 796, 783, 668, 677, 257/730, 737, 738.778, 775, 773, 777–777.779, 257/782, 704, 787, 785, 698, 784, 738, 778

(56) References Cited

U.S. PATENT DOCUMENTS

| | | | | |
|---|---|---|---|---|
| 4,392,151 A | * | 7/1983 | Iwatani ........................ 257/692 |
| 4,685,081 A | * | 8/1987 | Richman ........................ 365/1 |
| 4,862,322 A | * | 8/1989 | Bickford et al. ............. 361/386 |
| 4,878,108 A | * | 10/1989 | Phelps et al. ................ 257/796 |
| 5,091,251 A | * | 2/1992 | Sakumoto et al. .......... 428/352 |
| 5,182,852 A | * | 2/1993 | Montanari .................... 29/840 |
| 5,311,057 A | * | 5/1994 | McShane ..................... 257/676 |
| 5,550,711 A | * | 8/1996 | Burns et al. ................. 361/728 |
| 5,699,232 A | * | 12/1997 | Neidig et al. ................ 361/752 |
| 5,731,962 A | * | 3/1998 | Imura .......................... 361/813 |
| 5,760,465 A | * | 6/1998 | Alcoe et al. ................. 257/669 |
| 5,780,931 A | * | 7/1998 | Shimoda et al. ............ 257/789 |
| 5,814,882 A | * | 9/1998 | Shimada et al. ............ 257/704 |
| 5,898,212 A | * | 4/1999 | Kim ............................ 257/666 |
| 5,926,376 A | * | 7/1999 | Cho ............................ 257/686 |
| 5,963,433 A | * | 10/1999 | Kim ............................ 257/730 |
| 6,057,594 A | * | 5/2000 | Chia et al. ................... 257/668 |
| 6,091,251 A | * | 7/2000 | Wood et al. ................. 324/755 |
| 6,130,477 A | * | 10/2000 | Chen et al. .................. 257/712 |
| 6,134,776 A | * | 10/2000 | Hoffmeyer .................... 29/840 |
| 6,175,151 B1 | * | 1/2001 | Hashimoto ................... 257/676 |
| 6,334,971 B1 | * | 1/2002 | Huang ......................... 264/157 |
| 6,440,772 B1 | * | 8/2002 | Smith .......................... 438/106 |
| 6,703,707 B1 | * | 3/2004 | Mamitsu et al. ............ 257/718 |

FOREIGN PATENT DOCUMENTS

| | | | |
|---|---|---|---|
| JP | 6-252329 | * | 9/1994 |
| JP | 11-31713 | * | 2/1999 |

* cited by examiner

Primary Examiner—Alexander Oscar Williams
(74) Attorney, Agent, or Firm—Fletcher Yoder

(57) ABSTRACT

A technique is provided for dissipating heat from an integrated circuit within a package. A thermally conductive strip may be installed between an integrated circuit and a substrate before packaging. The package is formed from molded epoxy formed around the integrated circuit and substrate with a portion of the thermally conductive strip extending beyond the confines of the package. Heat is conducted from the integrated circuit through the thermally conductive strip to the environment surrounding the package. A thermally conductive strip may be installed within a package by an adhesive or other mechanically means. A thermally conductive strip may be comprised of a metallic foil or other thermally conductive material.

25 Claims, 5 Drawing Sheets

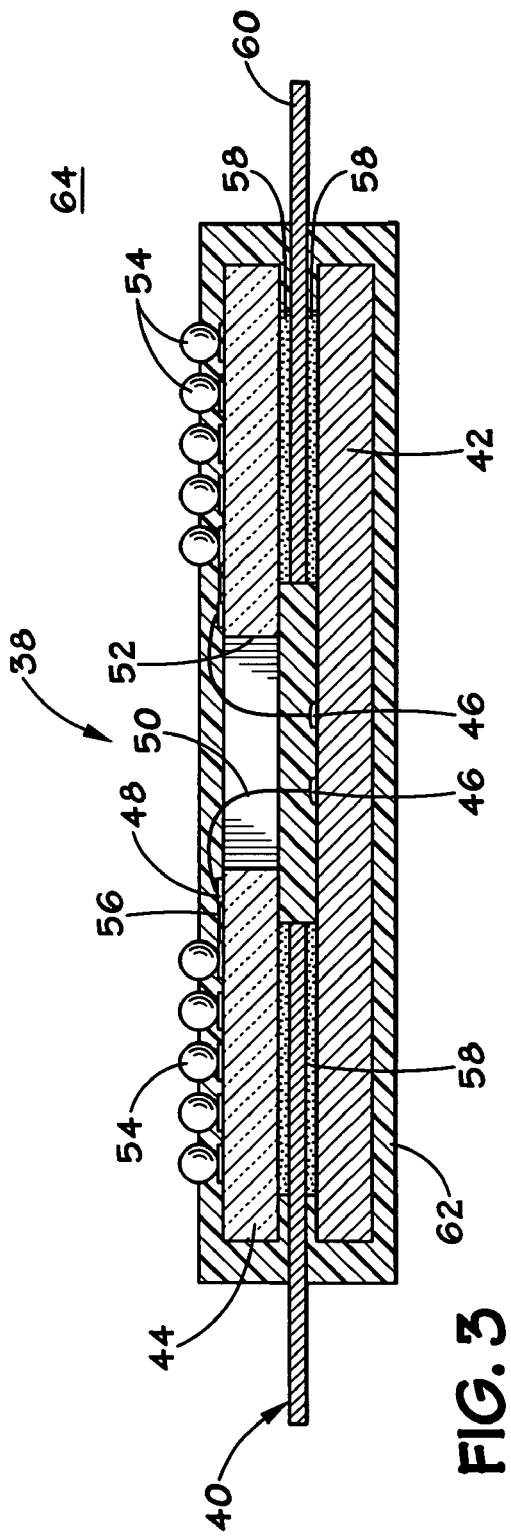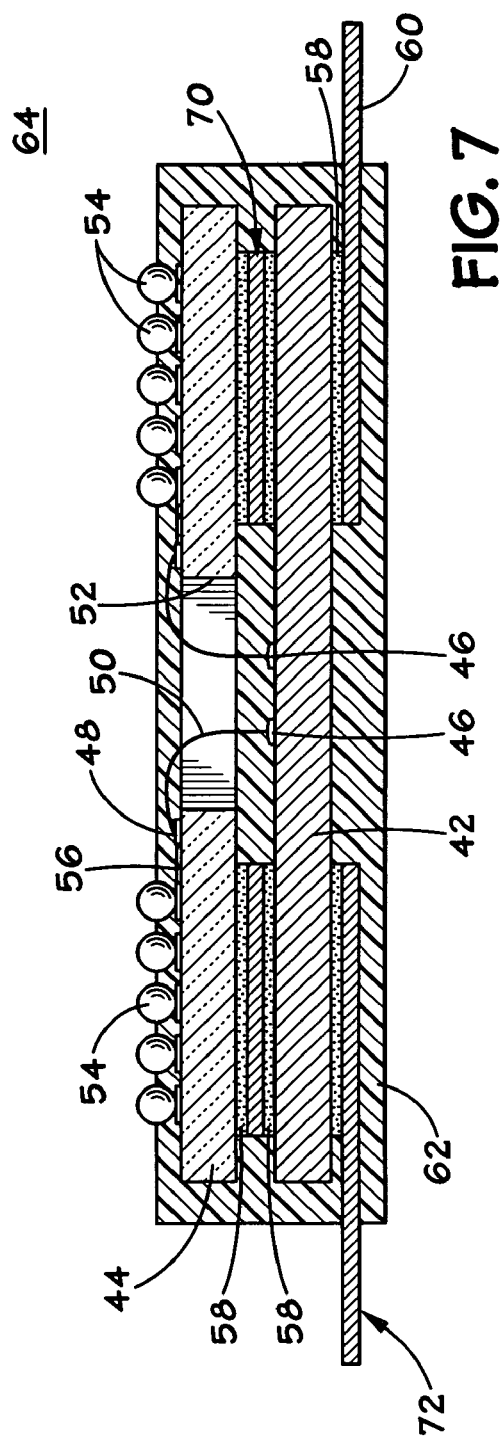

INTERNAL PACKAGE HEAT DISSIPATOR

BACKGROUND OF THE INVENTION

1. Field of the Invention

The present invention relates to semiconductor packaging. More particularly, the invention relates to an apparatus and method of packaging a semiconductor to dissipate heat generated within the semiconductor package.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Integrated circuits, such as microprocessors and memory devices, are used in a wide variety of applications. Such applications include personal computers, industrial control systems, telephone networks, and a host of consumer products, just to name a few. As most people are aware, an integrated circuit is a highly miniaturized electronic circuit that has revolutionized the functionality, dependability, and size of these various products.

In the manufacturing of integrated circuits, numerous microelectronic circuits are simultaneously fabricated on a semiconductor substrate. Such substrates are typically referred to as wafers, and a typical wafer includes a number of different regions, known as die regions. When the fabrication of the integrated circuits on the wafer is complete, the wafer is cut along these die regions to form individual die. Each die contains at least one microelectronic circuit, which is usually replicated on each die.

To use such a circuit in an electronic product, the die is typically placed within a sealed package. The sealed package performs several basic functions, such as electrically coupling the die to external electrical circuits, protecting the die from physical or environmental damage, and dissipating the heat generated within the die. One of the main functions of the package is to allow electrical connection of the die within the package to a circuit board or other external electrical components. Typically, these external electrical connections cannot be made directly to the die because of the thin and fragile bond wires used to interconnect the components on the die's surface. The diameters of the thinnest wires available are many times larger than the bond wires used on the surface of the die. Therefore, the die wiring typically terminates in larger bonding pads. The larger bonding pads allow external wires to be electrically connected to the die.

One method of integrated circuit packaging is known as lead-on-chip (LOC) packaging. LOC packages are generally used for very-large-scale integrated (VLSI) circuits or larger. Typically, the initial component in the packaging process is a leadframe. The leadframe provides the leads for the final package. The bonding pads formed on the die are electrically connected to lead fingers on the leadframe using fine bond wires. In an LOC package, the bonding pads are arranged down the center of the die. Typically, a double-sided adhesive tape is used to attach the die to the lead fingers of the leadframe. One side of the tape is applied to the underside of the leadframe. The die is then attached to the adhesive tape using pressure. Additionally, the lead fingers support the die during the encapsulation process.

A typical encapsulation material used in integrated circuit packaging is molded-epoxy. In a typical encapsulation process, a molding machine is charged with warmed pellets of the epoxy material. The molding machine forces a ram into the pellets to produce a liquid state in the epoxy. The liquid epoxy is then forced around the die on the leadframe. After the epoxy sets in the molding machine, the integrated circuits in their molded-epoxy packages are removed and placed in an oven for final curing.

Another function of the sealed package is to protect the die from physical or environmental damage. Physical damage can result in a myriad of ways, including jarring, physical abuse, and/or particle contamination. Environmental damage can result from chemicals, moisture, and even gases. Protection of the die is accomplished by securing the chip to a substrate or die-attachment area, and the die and substrate are then surrounded by an encapsulation material. The encapsulation material seals and protects the die and substrate within a protective cocoon.

Thermal management is another important factor in package design because some die can generate substantial amounts of heat during operation that, if not removed, will damage the die. The prime mechanisms of heat transfer involved with the thermal management of integrated circuit packages are conductive heat transfer and convective heat transfer. Conductive heat transfer, or conduction, is the process by which heat diffuses through a solid or a stationary fluid. In conduction, energy is transported from a region of higher temperature to a region of lower temperature by the drift of electrons. The property used to measure a materials ability to conduct heat is known as "thermal conductivity." A larger value of thermal conductivity indicates that a material is a better conductor of heat. For example, air is not a particularly good conductor of heat and has a corresponding thermal conductivity of 0.024 W/mK. Epoxies are slightly better conductors at 0.23 W/mK. Thermal greases are better conductors at 1.10 W/mK. Metals, however, are very good conductors of heat. Gold, for example, has a thermal conductivity of 298 W/mK. Two other metals have even higher thermal conductivities: copper at 395 W/mK and silver at 419 W/mK.

Convective heat transfer, or convection, is the process by which a moving fluid transfers heat to or from a surface. The motion of the fluid augments of the transfer of heat in convection. If the flow of fluid is not forced by a fan or pump, the mechanism of heat transfer could be either through conduction or natural convection. Natural convection can occur when the fluid near the surface heats up. The warmer fluid will be less dense than the cooler fluid above it and will rise. Thus carrying away heat. The process will continue as warmer fluid is displaced by cooler fluid.

Instead of the thermal conductivity (k) of the material, a term called the heat transfer coefficient (h) is used to simplify convection heat transfer calculations. The determination of the heat transfer coefficient is a very complicated matter because the coefficient can be affected by many factors. One factor is whether the convection is natural convection or forced convection. Forced convection is produced by a fan or pump forcing the flow of fluid. Generally, forced convection is a much better mechanism of heat transfer than natural convection. Another factor is the type of fluid flow, i.e., whether it is smooth laminar flow or whether it is violent turbulent flow.

The geometry of the body is also very important, i.e. whether the fluid is flowing over a flat plate, a sphere, or inside a pipe. The fluid involved in convection is a very important factor. All other factors being the same, the heat transfer coefficient will usually be much higher if water, rather than air, is the fluid transferring the heat.

It is possible for an integrated circuit to experience a catastrophic thermal failure. Catastrophic thermal failure is an immediate, thermally induced, total loss of electronic function. In most integrated circuits, heat is transferred from the die through the package by conduction. Heat is then removed from the surface of the package, typically, by convection to a ventilated enclosure. Therefore, the thermal properties of the material forming the package are an important factor in removing heat from the die. In some cases, the integrated circuits generate large quantities of heat that require greater amounts of heat to be transferred than can be achieved by conduction through the package without damaging the die.

Various methods have been used to assist the removal of heat generated within an integrated circuit. These methods may range from the use of a simple heat sink, to the use of fans, to even the use of cyrogenics, such as liquid nitrogen. Substantial differences in the performance and cost of the heat transfer methods, as well as the integrated circuits, guides the selection of a particular approach. However, the use of heat sinks is a commonly used method to remove heat from many integrated circuit packages. Generally, heat sinks are made of metal and shaped to include fins. Metals are used because metals, as described above, are generally good conductors of heat. The fins serve to increase the surface area in contact with the coolant, thereby increasing the heat transfer to the coolant. The heat sink is attached to the outer surface of the package. The heat produced within the die is transferred to the package by conduction. The heat is then transferred by conduction from the package to the heat sink. Finally, the heat is removed from the heat sink by either convection or conduction to the air surrounding the heat sink.

Before a heat sink can transfer heat to a fluid, the heat produced within the die must first be transferred through the package to the heat sink. A temperature gradient will be produced in the package with a higher temperature on the inside of the package near the die and a lower temperature on the outer surface of the package. For the same amount of heat transfer, a lower thermal conductivity (k) will produce a higher temperature gradient and, consequently, a higher die temperature. Unfortunately, integrated circuit package material usually consists of molded-epoxy or ceramic materials that are not good conductors of heat and have low thermal conductivities. Thus, current packaging materials produce a higher die temperature than could be produced if higher thermally conductive material were used.

There is a need, therefore, for an improved technique for removing the heat generated by a semiconductor device. In particular, there is a need for an improved system for removing the heat generated by a semiconductor device within a sealed package.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

The present invention provides an apparatus and technique for removing the heat generated within a sealed integrated circuit package. Moreover, the technique may also provide a mechanism for securing an integrated circuit die to a substrate.

In one favored approach, a thermally conductive strip, with a thermal conductivity higher than the packaging material, is used to dissipate heat from within an integrated circuit package. The thermally conductive strip can also be used to adhere an integrated circuit die to a substrate. A portion of the thermally conductive strip is within the package and a portion of the thermally conductive strip extends beyond the outer surface of the package into the surrounding environment. The integrated circuit package is disposed on a printed circuit board within an electronic device. During operation, heat is generated within the integrated circuit die and transferred to the thermally conductive strip by conduction. Heat is conducted through the thermally conductive strip from the portion of the thermally conductive strip within the package to the portion of the thermally conductive strip extending into the surrounding environment. Heat is transferred from the portion of the thermally conductive strip extending into the surrounding environment to the surrounding environment by forced convection. However, heat could also be transferred to the surrounding environment by natural convection or conduction or, alternatively, by conduction to a refrigeration system.

Thus, in accordance with a first aspect of the invention, a method is provided for assembling an integrated circuit package. The method includes disposing a thermally conductive strip, with a thermal conductivity higher than the packaging material, adjacent to an integrated circuit die. The method also includes forming a package around the integrated circuit and the thermally conductive strip, so that the thermally conductive strip extends through the package. The thermally conductive strip may be comprised of a metal, and portions of both sides of the metal may be covered with an adhesive to adhere the die to a substrate.

According to another aspect of the invention, an integrated circuit package is provided that includes a thermally conductive strip to dissipate heat generated by the integrated circuit die. The integrated circuit is packaged with the thermally conductive strip disposed adjacent to the integrated circuit die. The integrated circuit die and the thermally conductive strip is packaged within an encapsulation material. A portion of the thermally conductive strip extends through the package into the surrounding environment. The thermally conductive strip may be a double-sided adhesive metal tape. The metal tape may be used to adhere the integrated circuit die to a substrate.

According to another aspect of the invention, a thermally conductive strip is provided that is used to dissipate heat from an integrated circuit package. The thermally conductive strip is disposed adjacent to the integrated circuit die and extends outward from the outer surface of the package. The thermally conductive strip may be comprised of a metal foil with adhesive layers covering portions of both sides. The adhesive may be used to adhere the thermally conductive strip to an integrated circuit die and a substrate. One or more thermally conductive strips could be used. A thermally conductive strip with a hole could be used in a device using lead-on-chip packaging. The hole in the thermally conductive strip could be aligned with a hole in the substrate.

According to another aspect of the invention, a method is provided for dissipating heat from an integrated circuit. The method includes the act of disposing a conductive strip adjacent to the integrated circuit die during packaging. The conductive strip has a thermal conductivity that is higher than the thermal conductivity of material used to package the integrated circuit die. Heat is transferred from the integrated circuit die by the conduction through the conductive strip.

According to another aspect of the invention, a system is provided that utilizes an integrated circuit packaged with a thermally conductive strip. The thermally conductive strip is disposed within the integrated circuit package in proximity to the integrated circuit die and extends beyond the outer surface of the integrated circuit package. The integrated circuit is disposed on a printed circuit board within a protective enclosure. Heat generated by the integrated circuit die is transferred to the thermally conductive strip. The heat from the die is transferred through the thermally conductive strip to the surrounding environment. Heat may also be transferred to the surrounding environment by natural convection, conduction to the air, or conduction to a refrigeration system.

BRIEF DESCRIPTION OF THE DRAWINGS

The foregoing and other advantages of the invention will become apparent upon reading the following detailed description and upon reference to the drawings in which:

FIG. 3 illustrates a cross-sectional view of a first embodiment of the integrated circuit taken along line A—A of FIG. 2;

FIG. 7 illustrates a cross-sectional view of an alternative embodiment of the integrated circuit taken along line B—B of FIG. 6;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
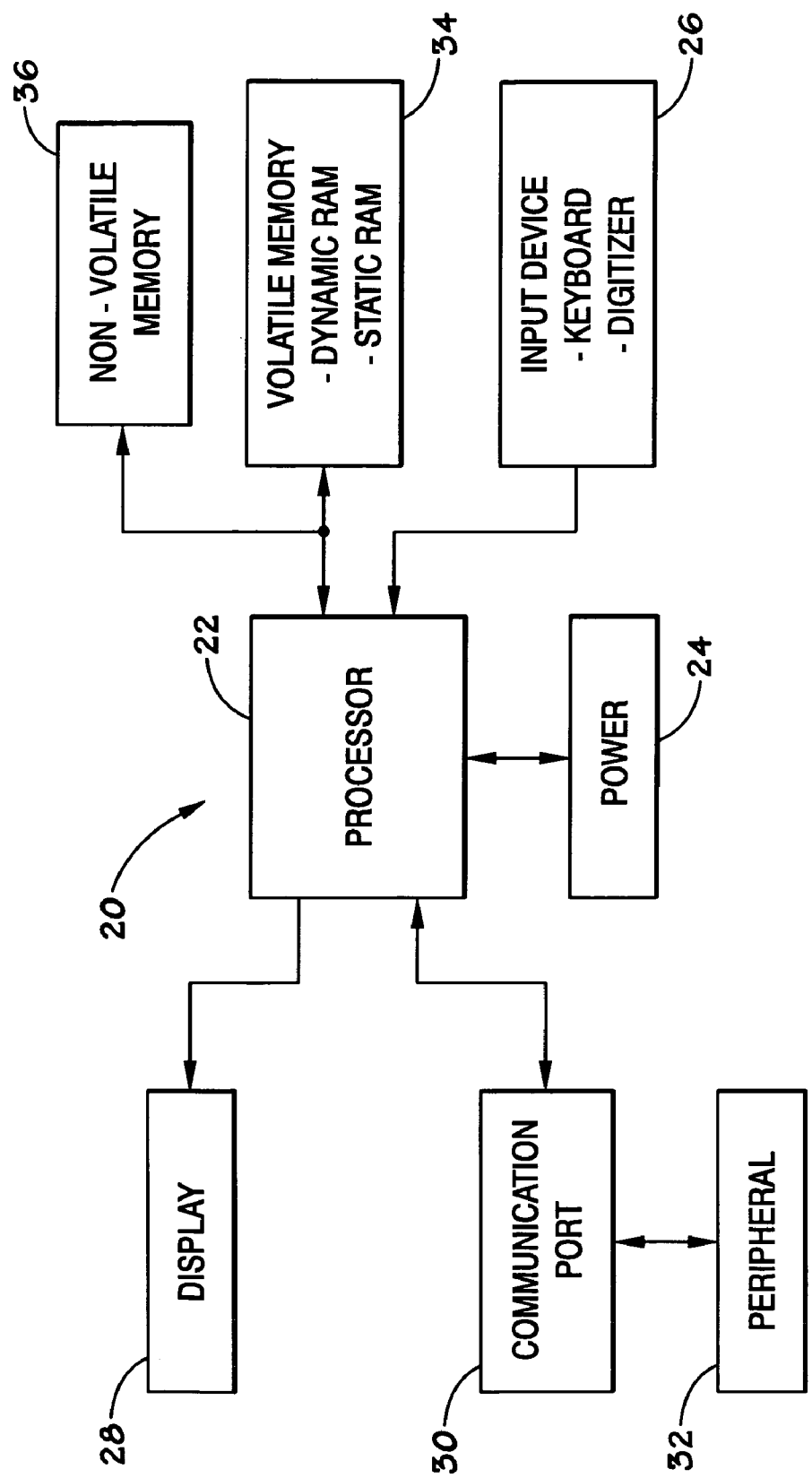
FIG. 1 illustrates a block diagram of an exemplary processor-based device, in accordance with the present invention.

Turning now to the drawings, and referring initially to FIG. 1, a block diagram depicting an exemplary processor-based device, generally designated by the reference numeral 20, is illustrated. The device 20 may be any of a variety of different types, such as a computer, pager, cellular telephone, personal organizer, control circuit, etc. The electronic device may include a processor 22 that controls the function of the device 20. Electrical power is provided to device 20 by a power supply 24. The configuration of the power supply 24 may vary depending upon the needs of the device 20. For instance, if the device 20 were intended to be portable then the power supply 24 would probably include permanent batteries, replaceable batteries, and/or rechargeable batteries. The power supply 24 may also include an A/C adapter, such as a wall adapter that would allow the device 20 to be plugged into a wall outlet. In fact, the power supply 24 could also include a D/C adapter so that the device 20 could be plugged into a vehicle's cigarette lighter.

Various other devices may be coupled to the processor 22 to enable the device 20 to perform its intended functions. For instance, a user interface 26 may be coupled to the processor 22. Examples of user interfaces 26 include: buttons, switches, a keyboard, a light pin, a mouse, or a voice recognition system. A display 28 may also be coupled to the processor 22. Examples of displays 28 include: an LCD display, a CRT, LEDs, or an audio display. A communications port 30 may also be coupled to the processor 22. The communications port 30 could be adapted to couple the processor 22 to a peripheral device 32, such as a modem, a printer, or a computer, or it may couple the device 20 to a network, such as a local area network or the Internet.

The processor 22 controls the functioning of the device 20 generally under the control of software programming. Electronic memory is coupled to the processor 22 to store and facilitate execution of the program. For instance, the processor 22 may be coupled to volatile memory 34, which may include dynamic random access memory (DRAM) and/or static random access memory (SRAM). The processor 22 may also be coupled to non-volatile memory 36. The non-volatile memory 36 may include a read only memory (ROM), such as an EPROM, to be used in conjunction with the volatile memory. The size of the ROM is typically selected to be just large enough to store the operating system, application programs, and fixed data. The volatile memory, on the other hand, is typically quite large so that it can store dynamically loaded applications. Additionally, the non-volatile memory 36 may include a high capacity memory such as a disk or tape drive memory.

As is clear from the above discussion, a processor-based device 20 may take many forms. The following figures and description illustrate an integrated circuit that could be used in a processor-based device. The integrated circuit could be utilized as a processor, electronic memory, or some other device. As mentioned previously, the integrated circuit operates electrically. The electricity flowing through an integrated circuit produces heat. In certain cases, the heat could eventually damage an integrated circuit if it is not removed. The figures described below illustrate exemplary integrated circuit devices that are constructed to increase the dissipation of heat from within the integrated circuit device, as compared with known integrated circuits.

Figure 2:
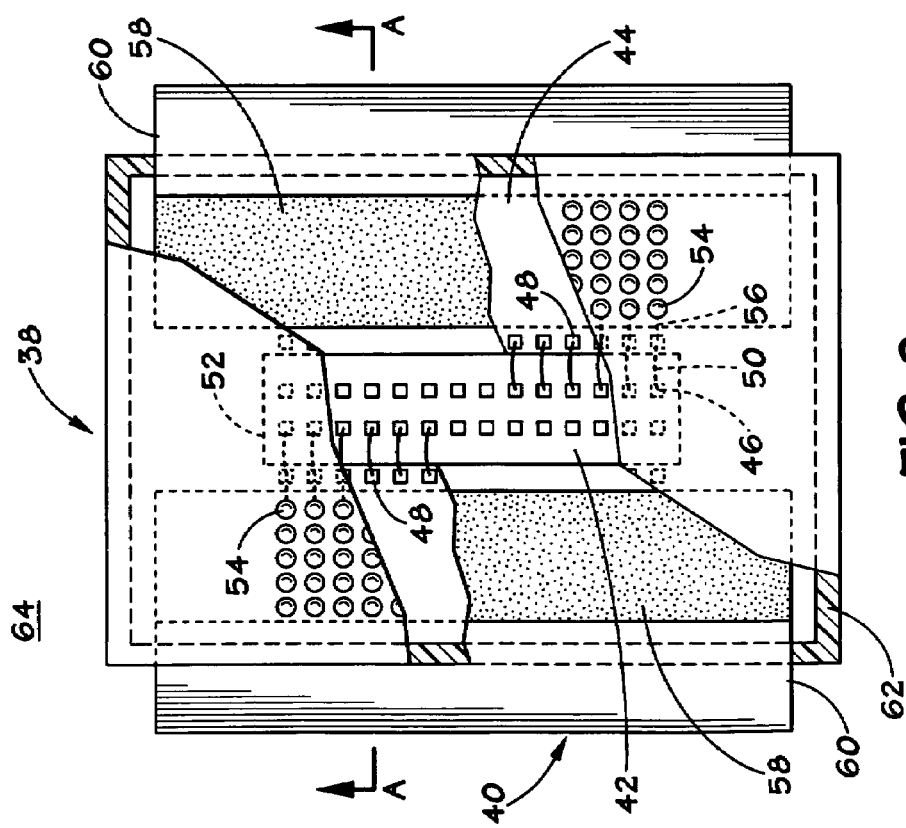
FIG. 2 illustrates a top view of a first embodiment of an integrated circuit, in accordance with the present invention.

Referring to FIG. 2, a top view is shown of an integrated circuit package 38 that utilizes a metallic tape 40 to dissipate heat from within the integrated circuit package 38. The metallic tape 40 is a better conductor of heat than the packaging material, such as molded epoxy, used to encapsulate the integrated circuit. The integrated circuit package 38 contains an integrated circuit die 42 and a substrate 44. In this view, the substrate 44 lies atop and is coextensive with the die 42.

The illustrated embodiment utilizes lead-on-chip (LOC) packaging. In LOC packaging, bonding pads 46 formed on the die 42 are electrically connected to bonding pads 48 formed on the substrate 44 using fine bond wires 50. The substrate 44 is generally rectangular shaped with a rectangular opening 52 near the center. The opening 52 in the substrate is provided to allow the fine bond wires 50 from the die 42 to reach the top side of the substrate 44, opposite the die 42. In this view, the die 42, underlying the substrate 44, is visible through the opening 52 in the substrate 44. However, the present invention is not believed to be limited to use in LOC packaging. The present invention may be utilized in a variety of packaging techniques in addition to LOC packaging, such as board-on-chip (BOC) packaging.

The illustrated embodiment is shown utilizing a ball grid array. In a ball grid array, the bonding pads 48 formed on the substrate 44 are electrically coupled to solder balls 54 via conductive traces 56 in the substrate 44. The integrated circuit is mounted and electrically coupled to an external device by briefly heating the solder balls 54 to a molten state and allowing the molten solder to flow between the integrated package and the external device. When the heat is removed, the molten solder will cool and solidify, forming a conductive bond. However, the present invention is not believed to be limited to use in a ball grid array. For example, the electrical connections in the integrated circuit package can be arranged in a pin grid array. Instead of solder balls 54, a pin grid array uses metal leads, or pins, to electrically couple the die 42 to an external circuit.

Typically, in LOC packaging, a double-sided adhesive tape is used to attach the die to the substrate. One side of the tape is applied to the underside of the substrate and the other side of the tape is attached to the die. The die and substrate are then attached to the adhesive tape using pressure and heat. A tape carrier dispenses the tape as part of the production process.

In the illustrated embodiment, the metallic tape 40 is used to connect the die 42 to the substrate 44. The metallic tape 40 is comprised of a thermally conductive adhesive 58 applied to a portion of both sides of a metallic foil 60. The adhesive bonds the die 42 to the foil 60 on one side and the substrate 44 to the foil 60 on the other side. The die 42 and substrate 44 are encapsulated in a molded-epoxy package 62. The metallic tape 40 is configured so that a portion of the metallic foil 60 extends beyond the confines of the molded-epoxy package 62. Heat is conducted from the die 42 to the metallic foil 60 via the thermally conductive adhesive 58. Heat is then conducted through the metallic foil 60 from the portion of the tape 40 inside the package 62 to the portion of the tape outside the package. Heat is then transferred from the tape 40 to the air in the environment 64 outside of the package 62 by convection. Typically, a processor-based device will be contained within a ventilated enclosure with a fan. The increased circulation of air caused by the fan will assist the convective heat transfer from the tape 40 to the environment 64.

Referring generally to FIG. 3, a cross-sectional view of the integrated circuit package is shown along line A—A of FIG. 2. As is more easily seen in this view, the substrate 44 is oriented above the die 42. In this embodiment, two strips of double-sided metallic tape are used to adhere the die 42 to the substrate 44. The adhesive 58 on one side of the metallic tape 40 adheres to the die 42 while the adhesive on the other side of the tape 40 adheres to the substrate 44. The metallic foil 60 from each of the pieces of tape 40 extends from the interior of the molded-epoxy package 62 to a distance outside the confines of the molded-epoxy package 62. Heat is removed by convection from the portion of the metal foil 60 extending beyond the confines of the package.

The material comprising the metallic foil 60 is advantageously of a very high thermal conductivity. Copper, gold, and silver are three examples of metals that might be used. However, the metal foil in the metallic tape could be any of a variety of suitable thermally conductive materials, including non-metals. The shape and thickness of the metal foil can be varied as desired. Generally, as the metal foil gets thicker it will become a better conductor of heat.

As illustrated, the metal foil is a flat rectangular strip. However, the tape could be configured in a variety of different shapes to enhance the heat transfer. For example, the sides of the tape that remain outside of the package could be constructed with fins to increase the surface area. Alternatively, the sides may be configured to mate with fins, or some other heat sink (not shown). Thus, for example, a water-cooled heat sink might be used to cool the ends of the metallic tape. This would greatly increase the heat transfer from the die. In fact, the tape need not extend beyond the surface of the package 62 to improve the heat transfer capabilities of the package. The higher thermal conductivity of the tape over that of the molded-epoxy in the package would result in a greater transfer of heat through the tape to the surface, rather than through a comparable thickness of molded-epoxy.

Figure 4:
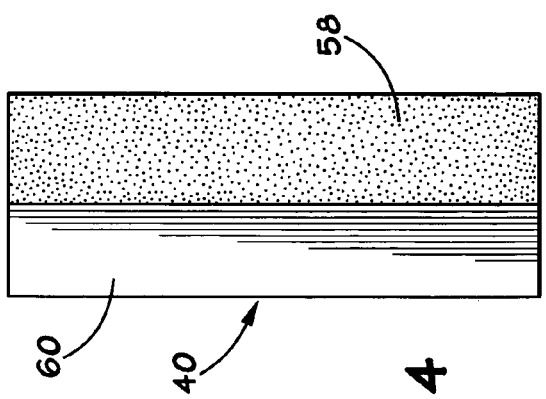
FIG. 4 illustrates a top view of a first embodiment of a thermally conductive strip, in accordance with the present invention.

In FIG. 4, a top view of an exemplary embodiment of a metallic tape 40 is shown. A portion of the top and bottom sides of the metallic foil 60 is covered by an adhesive 58. The adhesive 58 is advantageously thermally conductive. The metallic tape 40, as shown, is covered with adhesive 58 over approximately one-half of the surface area of each side. However, the adhesive is not limited to a particular configuration. The adhesive could over a larger or smaller portion of the tape depending on the requirements of the integrated circuit package.

Figure 5:
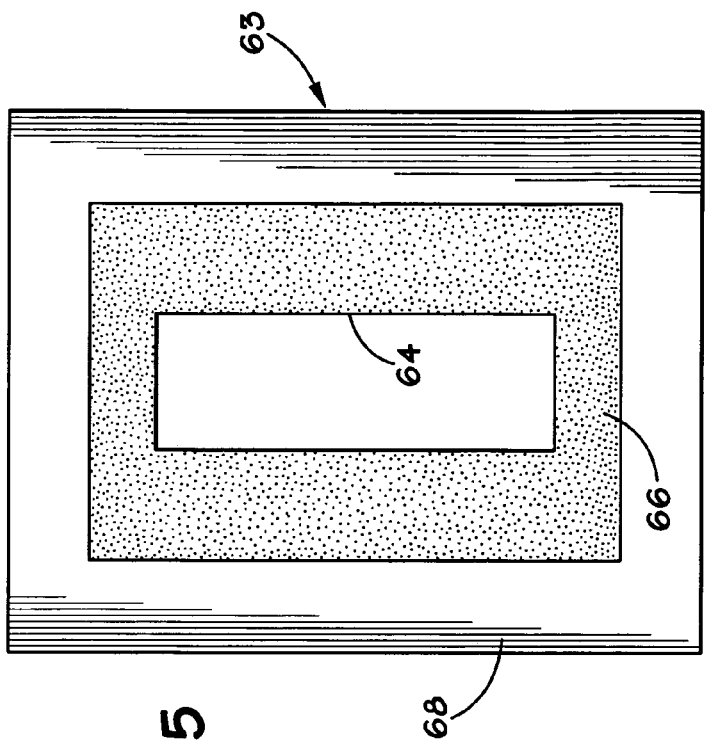
FIG. 5 illustrates a top view of an alternative embodiment of a thermally conductive strip, in accordance with the present invention.

As an alternative, rather than using two pieces of metallic tape to attach the die 42 to the substrate 44, a one-piece tape can be used. Referring generally to FIG. 5, an alternative embodiment of a one-piece metallic tape is shown. The one-piece metallic tape 63, as shown, is generally rectangularly-shaped and includes a generally rectangularly-shaped opening 64 near the center. The opening 64 is configured to align with the opening 52 in the substrate 44 so that bonding wires 50 can extend from the die 42 to the opposite surface of the substrate 44. A portion of the one-piece metallic tape 63 is covered with adhesive material 66 on both the top and the bottom side. A metallic foil 68 is also used in the one-piece tape, as with two pieces.

Figure 6:
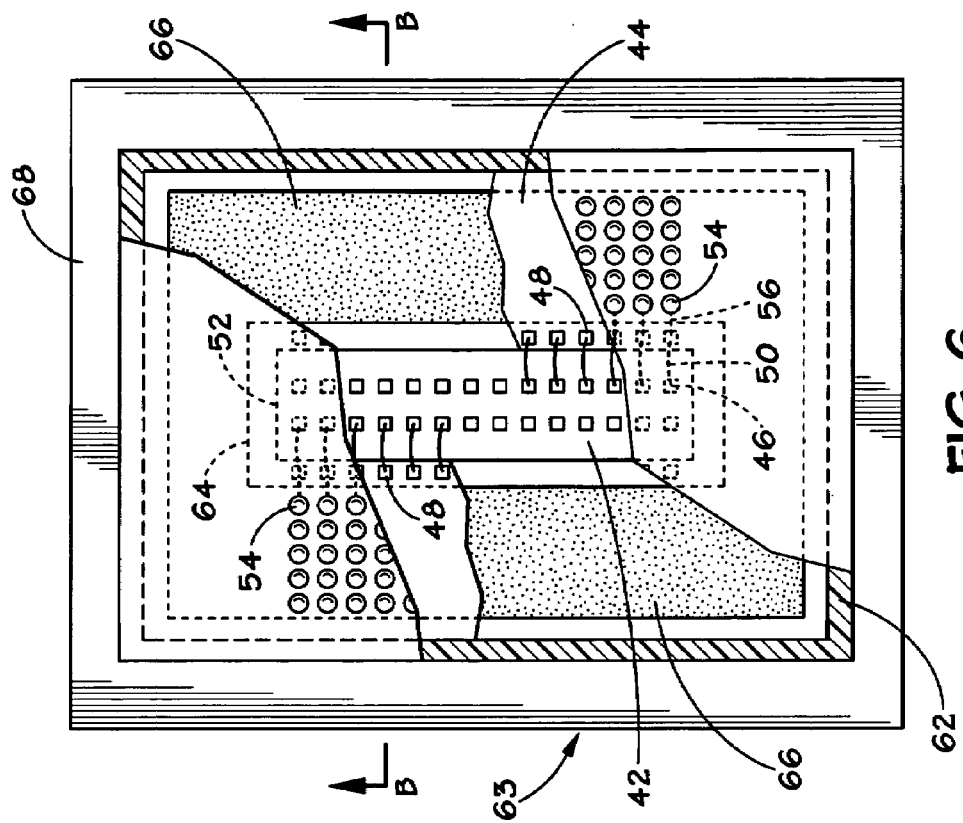
FIG. 6 illustrates a top view of an alternative embodiment of an integrated circuit, in accordance with the present invention.

Referring to FIG. 6, a top view of an integrated circuit is shown to further illustrate the orientation of the die 42, substrate 44, molded-epoxy package 62, and the one-piece metallic tape 63. As illustrated, the substrate 44 overlies the die 42. The one-piece metallic tape 63 is used to adhere the die 42 to the substrate 44. The adhesive 66 on one side of the metallic tape 63 adheres to the die 42 while the adhesive on the other side of the tape 63 adheres to the substrate 44. The metallic foil 68 in the tape 63 extends beyond the confines of the package 62 on all four sides. The rectangular opening 52 in the substrate 44 and the opening 64 in the metallic tape 63 can also be seen in this illustration.

Figure 8:
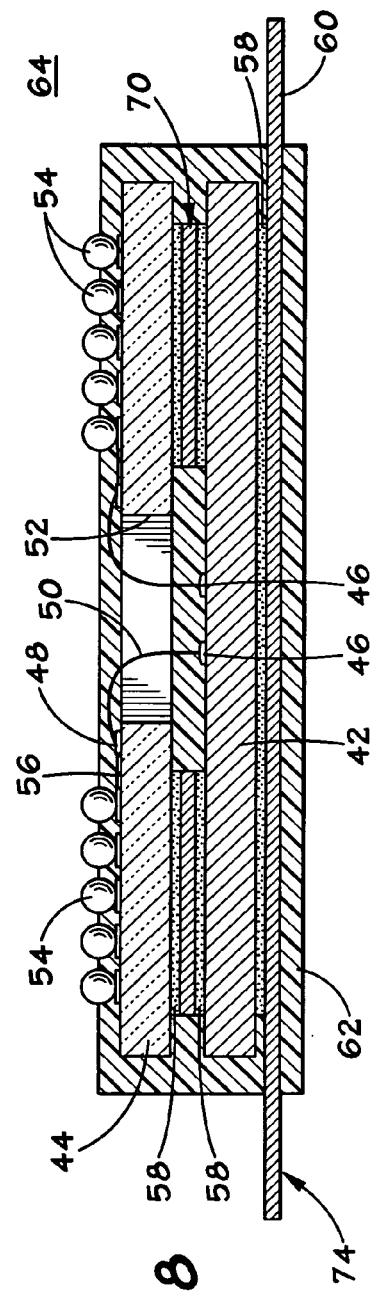
FIG. 8 illustrates a cross-sectional view of an alternative embodiment of an integrated circuit, in accordance with the present invention.

Alternatively, a thermally conductive tape can be used purely for heat dissipation, without functioning as the adhesive to adhere a die to a substrate. In FIGS. 7 and 8, alternative embodiments are shown that use a conventional double-sided tape 70 to adhere the die to the substrate. However, heat dissipation from the die is enhanced by metallic tape placed on the back side of the die 42. In this application, the metallic tape need not be double-sided. Two pieces of tape 72 could be used, as illustrated in FIG. 7, or a one-piece tape 74 could be used, as illustrated in FIG. 8.

Figure 9:
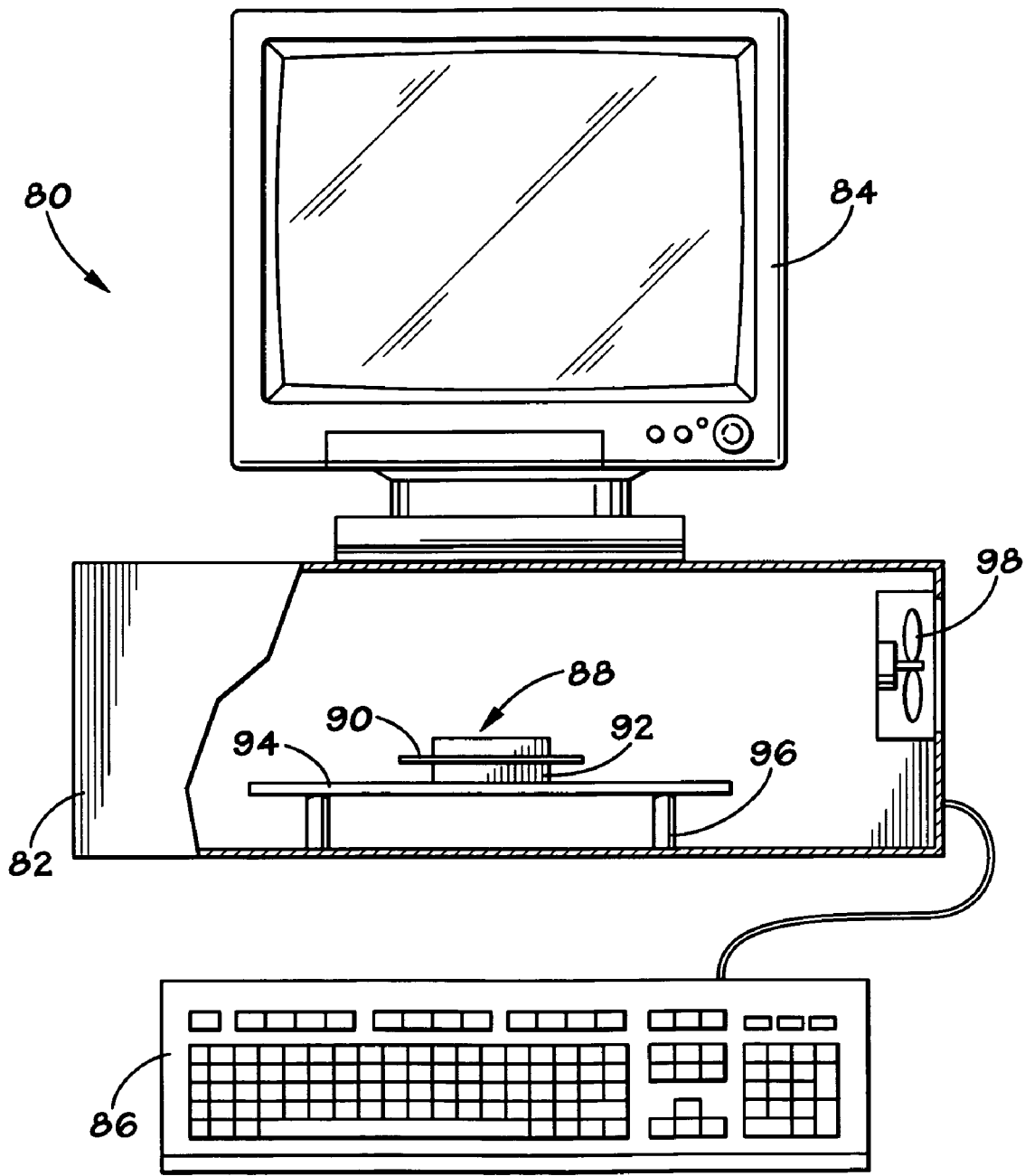
FIG. 9 illustrates the interior of a processor-based device utilizing an integrated circuit packaged with a thermally conductive strip extending beyond the surface of the package.

In FIG. 9, a processor-based system 80 is shown. The processor-based device 80 comprises an enclosure 82, a monitor 84, and a keyboard 86. The system 80 utilizes an integrated circuit 88 with a thermally conductive strip 90 extending beyond the surface of the package 92. The integrated circuit 88 could be a microprocessor, a memory chip or some other semiconductor device. The integrated circuit 88 is disposed on a printed circuit board 94. The printed circuit board 94 is secured within the enclosure 82 by several mounting feet 96. Heat produced within the integrated circuit 88 is conducted through the thermally conductive strip 90 to the outside of the package 92. Heat is removed from the thermally conductive strip 90 by convection to air circulated through the enclosure by an electric fan 98.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An integrated circuit package, comprising:
   an integrated circuit;
   a thermally conductive strip disposed adjacent to and electrically isolated from the integrated circuit; and
   an encapsulation material surrounding a portion of the thermally conductive strip such that a portion of the thermally conductive strip extends through the encapsulation material into a surrounding environment.

2. The apparatus of claim 1, comprising an adhesive layer disposed between the thermally conductive strip and the integrated circuit.

3. The apparatus of claim 2, wherein the thermally conductive strip comprises the adhesive layer.

4. The apparatus of claim 2, wherein heat is transferred by conduction from the integrated circuit through the adhesive layer to the thermally conductive strip.

5. The apparatus of claim 1, wherein the integrated circuit comprises a substrate coupled to a die.

6. The apparatus of claim 5, comprising an adhesive layer disposed between the thermally conductive strip and the substrate.

7. The apparatus of claim 6, wherein the adhesive layer is deposited on the thermally conductive strip.

8. An apparatus for dissipating heat generated by an integrated circuit, comprising:
   a thermally conductive strip disposed adjacent to an integrated circuit die encapsulated within an integrated circuit package, the strip being electrically isolated from the integrated circuit die and extending through the integrated circuit package into a surrounding environment to remove heat from the integrated circuit die.

9. The apparatus of claim 8, comprising a first adhesive layer disposed on a first portion of the thermally conductive strip, wherein the first adhesive layer adheres the thermally conductive strip to the integrated circuit die.

10. The apparatus of claim 9, comprising a second adhesive layer disposed on a second portion of the thermally conductive strip, wherein the second adhesive layer adheres the thermally conductive strip to a substrate.

11. The apparatus of claim 10, wherein the substrate comprises a hole through the substrate.

12. The apparatus of claim 11, wherein a plurality of thermally conductive strips are disposed generally around the outer perimeter of the hole through the substrate.

13. The apparatus of claim 11, comprising a hole through the thermally conductive strip.

14. The apparatus of claim 13, wherein the thermally conductive strip is disposed so that the hole in the thermally conductive strip aligns with the hole through the substrate.

15. The apparatus of claim 8, wherein the thermally conductive strip comprises metal.

16. The apparatus of claim 15, wherein the thermally conductive strip comprises a metallic foil.

17. The apparatus of claim 8, wherein the thermally conductive strip comprises a double-sided adhesive metallic tape.

18. An integrated circuit comprising:
    an integrated circuit die;
    an integrated circuit package;
    a thermally conductive strip disposed adjacent to the integrated circuit die and extending through the integrated circuit package into a surrounding environment, wherein the thermally conductive strip and the integrated circuit die are electrically isolated; and
    means for thermally coupling heat from the integrated circuit die to the thermally conductive strip.

19. An electronic device, comprising:
    an enclosure;
    a printed circuit board disposed in the enclosure;
    an integrated circuit package disposed on the printed circuit board;
    an integrated circuit disposed within the integrated circuit package; and
    a thermally conductive adhesive strip disposed within the integrated circuit package adjacent to the integrated circuit and extending outward from the integrated circuit package into a surrounding environment.

20. The apparatus of claim 19, wherein the integrated circuit comprises a microprocessor and a memory device.

21. An integrated circuit comprising:
    an integrated circuit die disposed within an encapsulate;
    a plurality of leads electrically coupled to the integrated circuit die and extending through the encapsulate; and
    a thermally conductive strip disposed adjacent to the integrated circuit die and electrically isolated from the plurality of leads, wherein the thermally conductive strip extends through the encapsulate to at least an outer surface of the encapsulate to conduct heat from the integrated circuit die.

22. The integrated circuit as recited in claim 21, wherein the thermally conductive strip extends beyond the outer surface of the encapsulate into the surrounding environment.

23. The integrated circuit as recited in claim 22, wherein the thermally conductive strip comprises a top surface and a bottom surface that extend into the surrounding environment.

24. An integrated circuit comprising:
- an integrated circuit die;
- an encapsulate, wherein the integrated circuit die is disposed within the encapsulate;
- a plurality of leads electrically coupled to the integrated circuit die and extending from the encapsulate; and
- a thermally conductive strip in thermal communication with the integrated circuit die and electrically isolated from the plurality of leads, wherein the thermally conductive strip extends through the encapsulate into a surrounding environment to expose a top surface and a bottom surface of the thermally conductive strip to the surrounding environment.

25. The integrated circuit as recited in claim 24, wherein the thermally conductive strip is cantilevered.

* * * * *